United States Patent
Tahara et al.

(10) Patent No.: US 9,190,591 B2
(45) Date of Patent: Nov. 17, 2015

(54) ULTRAVIOLET IRRADIATION HEAD AND ULTRAVIOLET IRRADIATOR

(71) Applicant: Panasonic Industrial Devices SUNX Co., Ltd., Kasugai-shi (Aichi-ken) (JP)

(72) Inventors: Akihiro Tahara, Kasugai (JP); Tsuyoshi Inui, Kasugai (JP); Noriyuki Taguchi, Kasugai (JP); Yoshiyuki Nakazono, Kasugai (JP); Kanto Imai, Kasugai (JP)

(73) Assignee: Panasonic Industrial Devices SUNX Co., Ltd., Aichi-ken (JP)

( * ) Notice: Subject to any disclaimer, the term of this patent is extended or adjusted under 35 U.S.C. 154(b) by 0 days.

(21) Appl. No.: 14/546,839

(22) Filed: Nov. 18, 2014

(65) Prior Publication Data

US 2015/0221844 A1 Aug. 6, 2015

(30) Foreign Application Priority Data

Feb. 6, 2014 (JP) ................................ 2014-021764

(51) Int. Cl.
*B41J 2/01* (2006.01)
*H01L 33/64* (2010.01)
*H01L 27/15* (2006.01)

(52) U.S. Cl.
CPC ............ *H01L 33/645* (2013.01); *H01L 27/153* (2013.01)

(58) Field of Classification Search
CPC ......... B41J 2/01; H01L 33/645; H01L 27/153
USPC ......................................................... 347/102
See application file for complete search history.

(56) References Cited

U.S. PATENT DOCUMENTS

| 2008/0073838 A1* | 3/2008 | Sakaida ........................ 271/276 |
| 2009/0002669 A1* | 1/2009 | Liu et al. ......................... 355/67 |
| 2012/0133716 A1* | 5/2012 | Aizawa et al. ................ 347/102 |
| 2014/0185300 A1* | 7/2014 | Martinez et al. .............. 362/294 |
| 2014/0268551 A1* | 9/2014 | Van Pelt et al. .......... 361/679.48 |

FOREIGN PATENT DOCUMENTS

| JP | 2011005788 A | 1/2011 |
| JP | 2012004454 A | 1/2012 |

* cited by examiner

*Primary Examiner* — Alessandro Amari
*Assistant Examiner* — Michael Konczal
(74) *Attorney, Agent, or Firm* — Faegre Baker Daniels LLP

(57) ABSTRACT

A heat sink is thermally connected to a substrate on which LED elements are mounted. A fan unit is arranged near the distal end of a fin segment of the heat sink. A vent hole is formed in a case so as to expose the base end of the fin segment entirely in a direction in which fins are aligned. The heat sink is configured such that a gap between the fins is substantially blocked in a part except where the vent hole is present. The gap is an opening extending in a width direction perpendicular to the direction in which the fins are aligned. Space between the distal end of the fin segment and the fan unit functions as a pressure chamber that is placed in a positively pressurized condition or a negatively pressurized condition by cooling air traveling from the fan unit.

3 Claims, 5 Drawing Sheets

ULTRAVIOLET IRRADIATION HEAD AND ULTRAVIOLET IRRADIATOR

TECHNICAL FIELD

The present invention relates to an ultraviolet irradiation head including a heat dissipation structure for an ultraviolet LED element, and an ultraviolet irradiator using the ultraviolet irradiation head.

BACKGROUND

The ultraviolet irradiator is used for irradiating an ultraviolet curable material with an ultraviolet ray and curing the material. For example, the ultraviolet irradiator includes a collection of multiple ultraviolet LED elements as a light source of an irradiation head. Change in an ambient temperature caused by heat generated by the ultraviolet LED elements changes the intensities of ultraviolet rays emitted from the ultraviolet LED elements. Thus, the ultraviolet irradiator including the collection of the LED elements is equipped with a heat dissipation structure provided together with a light source to obtain stable ultraviolet rays.

A heat dissipation structure disclosed for example in Japanese Laid-Open Patent Publication No. 2011-5788 or Japanese Laid-Open Patent Publication No. 2012-4454 includes a substrate on which LED elements are mounted, a heat sink arranged on the back surface of the substrate, and a fan unit that supplies cooling air to a fin of the heat sink. The heat sink and the fan unit efficiently dissipate heat from the LED elements.

However, failing to uniformly dissipate heat from the collection of the ultraviolet LED elements causes variation in the respective intensities of ultraviolet rays emitted from the multiple ultraviolet LED elements. In the case of a line irradiation head, for example, the respective intensities of ultraviolet rays from the multiple ultraviolet LED elements vary in a direction in which the LED elements are aligned in a linear pattern. This makes the curing condition of an ultraviolet curable material vary in the direction in which the ultraviolet LED elements are aligned.

SUMMARY

It is an object of the present invention to provide an ultraviolet irradiation head capable of dissipating heat from multiple ultraviolet LED elements uniformly and making the intensities of ultraviolet rays emitted from the LED elements uniform as a whole and an ultraviolet irradiator using the ultraviolet irradiation head.

In order to achieve the aforementioned object, a first aspect of the present invention provides an ultraviolet irradiation head including a substrate, multiple ultraviolet LED elements arranged on the substrate, a heat sink thermally connected to the substrate, and a fan unit. The heat sink includes a fin segment formed of multiple fins aligned in a direction in which the ultraviolet LED elements are aligned. Cooling air traveling from the fan unit acts on the fin segment to cool the ultraviolet LED elements. The fan unit is arranged near a distal end of the fin segment. A vent hole is formed in a case of the irradiation head. The vent hole is formed so as to expose a base end of the fin segment entirely in the direction in which the fins are aligned. The heat sink is configured such that each gap between the fins is substantially blocked in a part other than where the vent hole is present. The gap is an opening extending in a width direction perpendicular to the direction in which the fins are aligned. Space between the distal end of the fin segment and the fan unit functions as a pressure chamber, which is placed in a positively pressurized condition or a negatively pressurized condition by the air flow from the cooling fan unit.

DETAILED DESCRIPTION

An embodiment that embodies an ultraviolet irradiator (ultraviolet irradiation head) of the present invention is described below by referring to FIGS. 1 to 5. For the description of the ultraviolet irradiator, a width direction, a depth direction, and a longitudinal direction are defined as shown in FIGS. 1, 2, 4, and 5.

Figure 1:
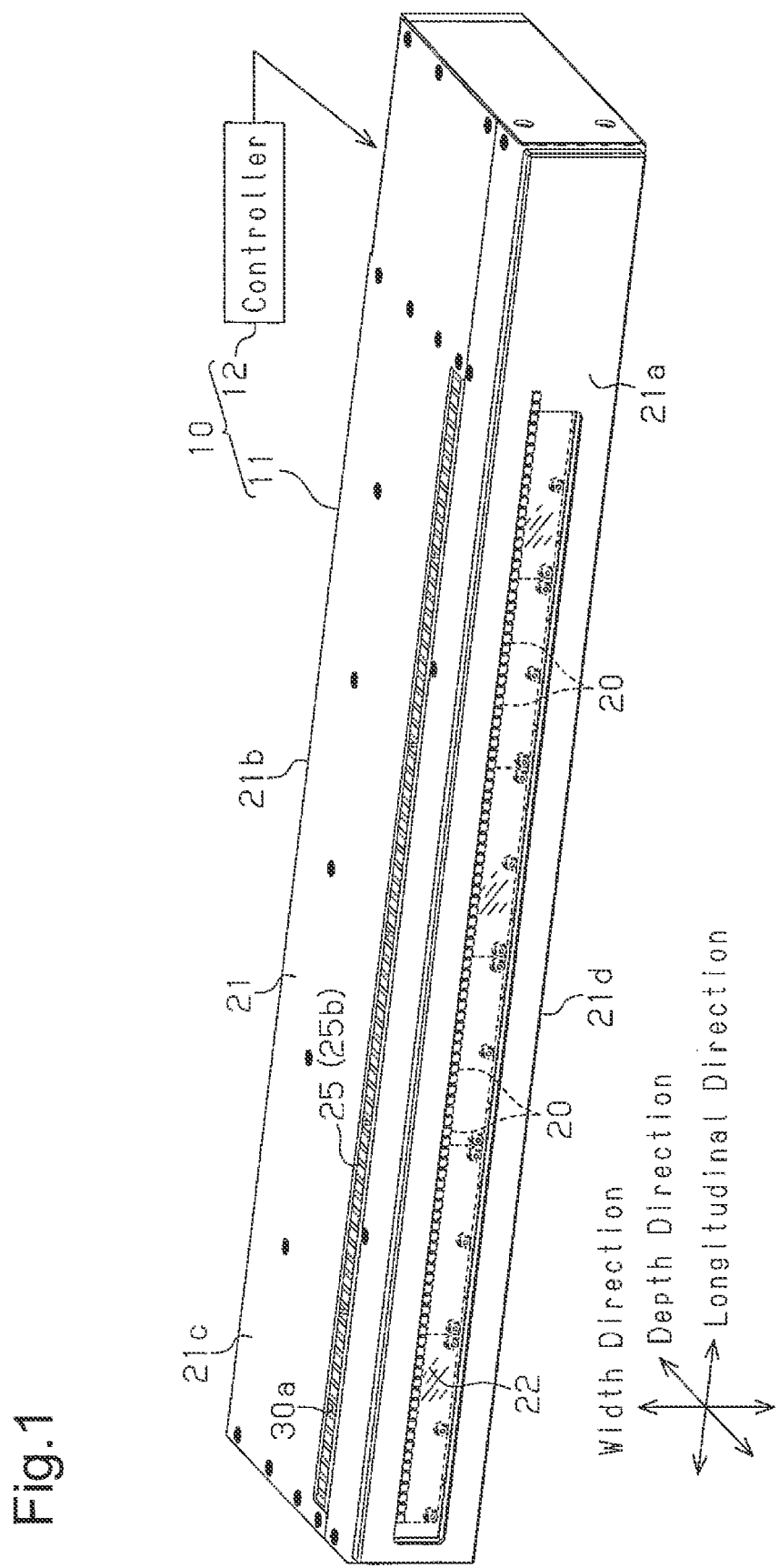
FIG. 1 is a perspective view of an irradiation head in an ultraviolet irradiator of an embodiment of the present invention.
Figure 2:
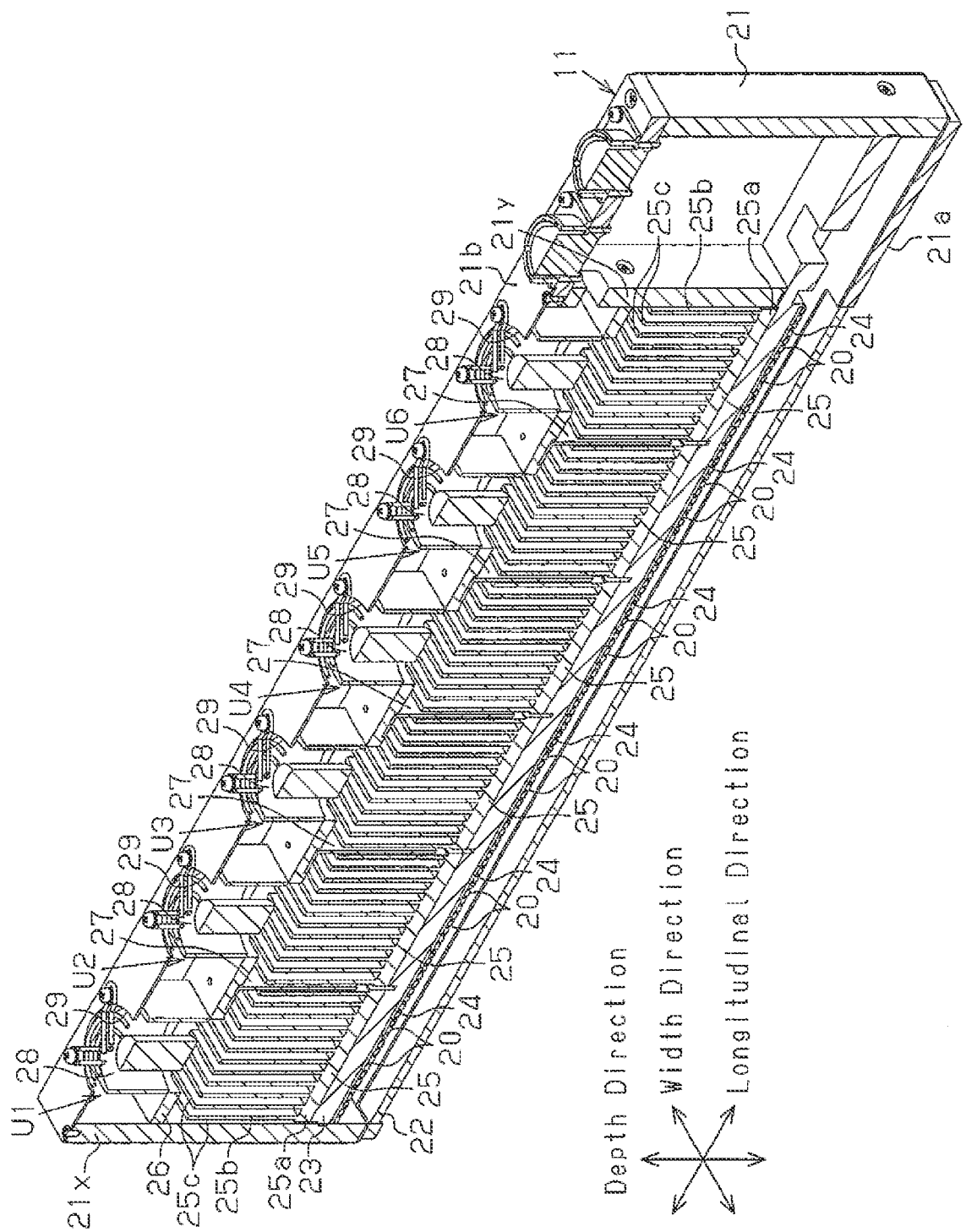
FIG. 2 is a sectional perspective view of the irradiation head.

As shown in FIG. 1, an ultraviolet irradiator 10 includes an ultraviolet irradiation head (hereinafter called an irradiation head) 11 and a controller 12. The ultraviolet irradiator 10 emits an ultraviolet ray from a light source of the irradiation head 11 for curing an ultraviolet curable material.

As shown in FIGS. 1 to 5, the irradiation head 11 is a line irradiation head formed of multiple ultraviolet LED elements (hereinafter called LED elements) as a light source arranged in a linear pattern. More specifically, the irradiation head 11 includes a case 21 in the form of a rectangular box. The case 21 extends in the direction in which the LED elements 20 are aligned. The case 21 has six outer side surfaces including a front surface 21a and a back surface 21b. The front and back surfaces 21a and 21b are each formed of the longest side and the shortest side. A window member 22 is fitted to the front surface 21a so as to hermetically close the LED elements 20. The window member 22 allows ultraviolet rays emitted from the LED elements 20 to pass therethrough. The window member 22 has a rectangular shape extending in a way corresponding to a row of the LED elements 20. The longitudinal direction of the irradiation head 11 agrees with the direction in which the LED elements 20 are aligned.

A base plate 23 is arranged behind the window member 22. Like the window member 22, the base plate 23 has a rectangular shape. The base plate 23 is fixed to the case 21. The base plate 23 is made of metal. A surface of the base plate 23 facing the window member 22 is provided with six substrates 24 on which the LED elements 20 are mounted. Each substrate 24 has a rectangular shape and is arranged such that the long axis of the substrate 24 is pointed to the longitudinal direction of the base plate 23. All the substrates 24 are fixed to the base plate 23 while being aligned in the longitudinal direction of the base plate 23. Eighteen LED elements 20 are attached to each substrate 24. The LED elements 20 are aligned in a linear pattern and are spaced uniformly. Thus, the aforementioned arrangement of the six substrates 24 relative to the base plate 23 forms a long row of the LED elements 20. The row of the LED elements 20 is arranged to face the window member 22. Thus, ultraviolet rays emitted from the LED elements 20 pass through the window member 22 to exit out of the ultraviolet irradiator 10.

The inside of the irradiation head 11 is formed of six units U1 to U6. Each of the units U1 to U6 includes one substrate 24 on which the LED elements 20 are mounted, one heat sink 25, and one fan unit 28 that are common to the units U1 to U6. In the longitudinal direction of the case 21, the six substrates 24 are aligned, the six heat sinks 25 are aligned, and the six fan units 28 are aligned. The substrates 24, the heat sinks 25, and the fan units 28 are housed in the case 21. The number of the units can be changed between one to five or seven or more according to the specifications of the irradiation head 11. The base plate 23 or the case 21 can be changed in length according to the number of the units.

The heat sink 25 is fixed to a surface of the base plate 23 on the opposite side of the substrate 24. The heat sink 25 is made of a metallic material having high heat dissipation performance. The heat sink 25 is thermally connected to the base plate 23 by abutting contact therebetween. This efficiently transfers heat generated by the LED elements 20 to the heat sink 25 via the base plate 23. Like the substrates 24, the six heat sinks 25 are housed in the irradiation head 11. The heat sinks 25 are aligned in the longitudinal direction of the base plate 23.

Figure 5:
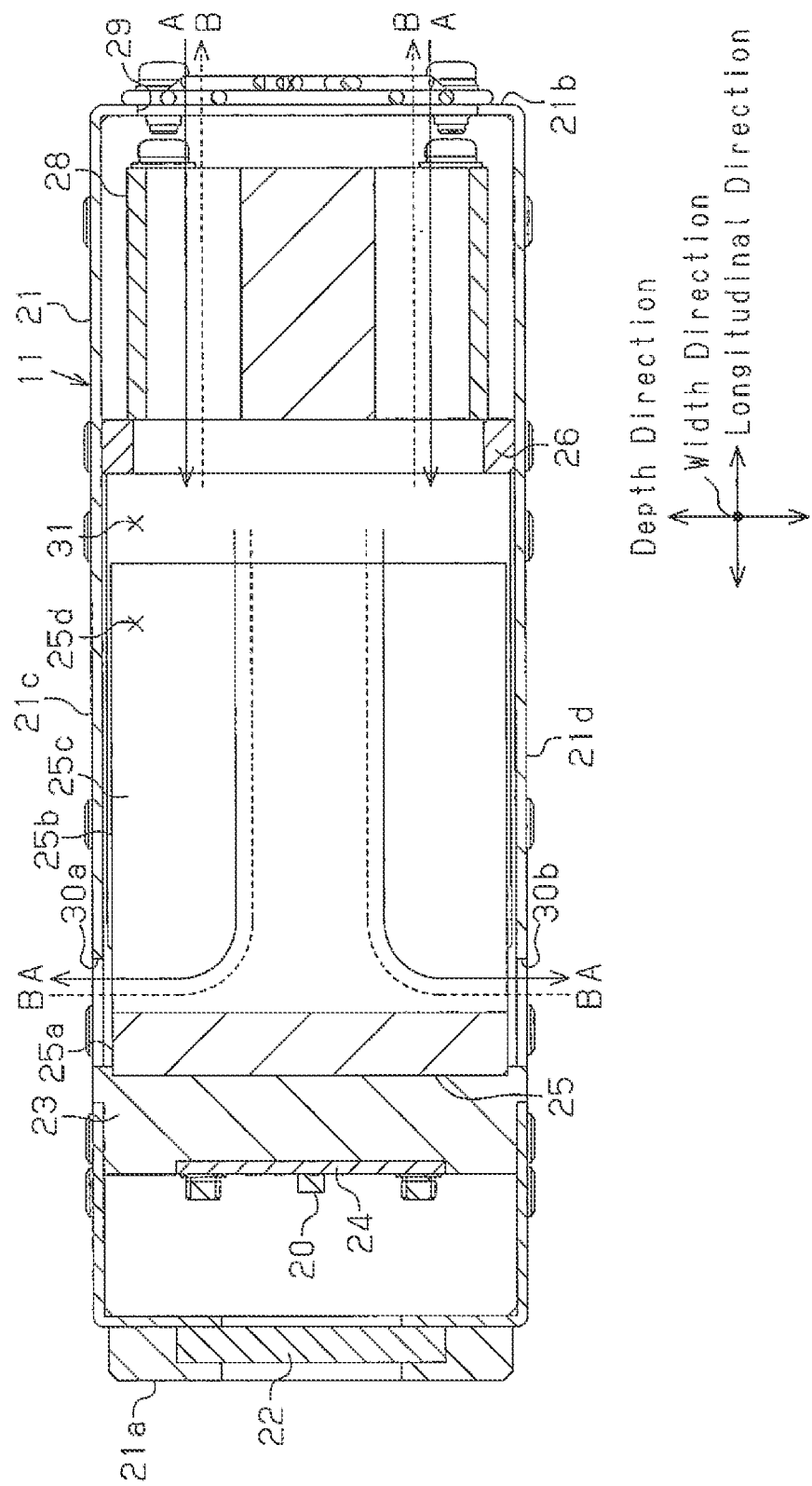
FIG. 5 is a sectional view taken along line 5-5 of FIG. 4.

The heat sink 25 includes a base segment 25a and a fin segment 25b. The base segment 25a has a rectangular shape and has an area substantially the same as that of the substrate 24. The widest surface of the base segment 25a forms surface contact with the base plate 23. A surface of the base segment 25a on the opposite side of the base plate 23 is provided with the fin segment 25b formed of multiple fins 25c. The fins 25c are formed of rectangular thin plates extending in the width and depth directions of the irradiation head 11. The number of the fins 25c is the same as or larger than the number of the LED elements 20. To avoid complexity, only 12 fins 25c are shown in each drawing. All the fins 25c are spaced uniformly in the longitudinal direction of the base plate 23. In other words, the fin segment 25b has a rectangular shape as viewed in the longitudinal direction and a comb-like shape as viewed in the width direction. The case 21 has a side surface 21c and a side surface 21d in a pair facing each other in the width direction of the irradiation head 11. As shown in FIG. 5, the fin segment 25b and the base segment 25a are near the side surfaces 21c and 21d of the case 21 and substantially abut on the side surfaces 21c and 21d.

A base plate 26 is arranged near a distal end of the fin segment 25b. The base plate 26 is spaced by a given distance from the distal end of the fin segment 25b. The base plate 26 is fixed to the case 21.

Five partition plates 27 are fixed to the base plate 26 for partitioning between adjacent ones of the units U1 to U6 and adjacent ones of the heat sinks 25. The partition plates 27 are made of rectangular thin plates extending in the width and depth directions of the irradiation head 11. A distal end of the partition plate 27 extends as far as the base end of the fin segments 25b of the heat sink 25, more specifically, to the vicinity of the base segment 25a. The unit U1 in the outermost part is arranged in space defined by a side wall member 21x of the case 21 and the partition plate 27. The unit U6 on the opposite side of the unit U1 is arranged in space defined by a side wall member 21y of the case 21 and the partition plate 27. The side wall member 21x forms a part of the outer wall of the case 21. The side wall member 21y forms a part of the inner wall of the case 21. Each of the units U2 to U5 is arranged in space defined by the partition plates 27 in a pair. In addition defining the space for each of the units U1 to U6, the partition plates 27 suppress transfer of heat generated in each space. Specifically, the partition plates 27 further function as a heat-insulating member.

Figure 3:
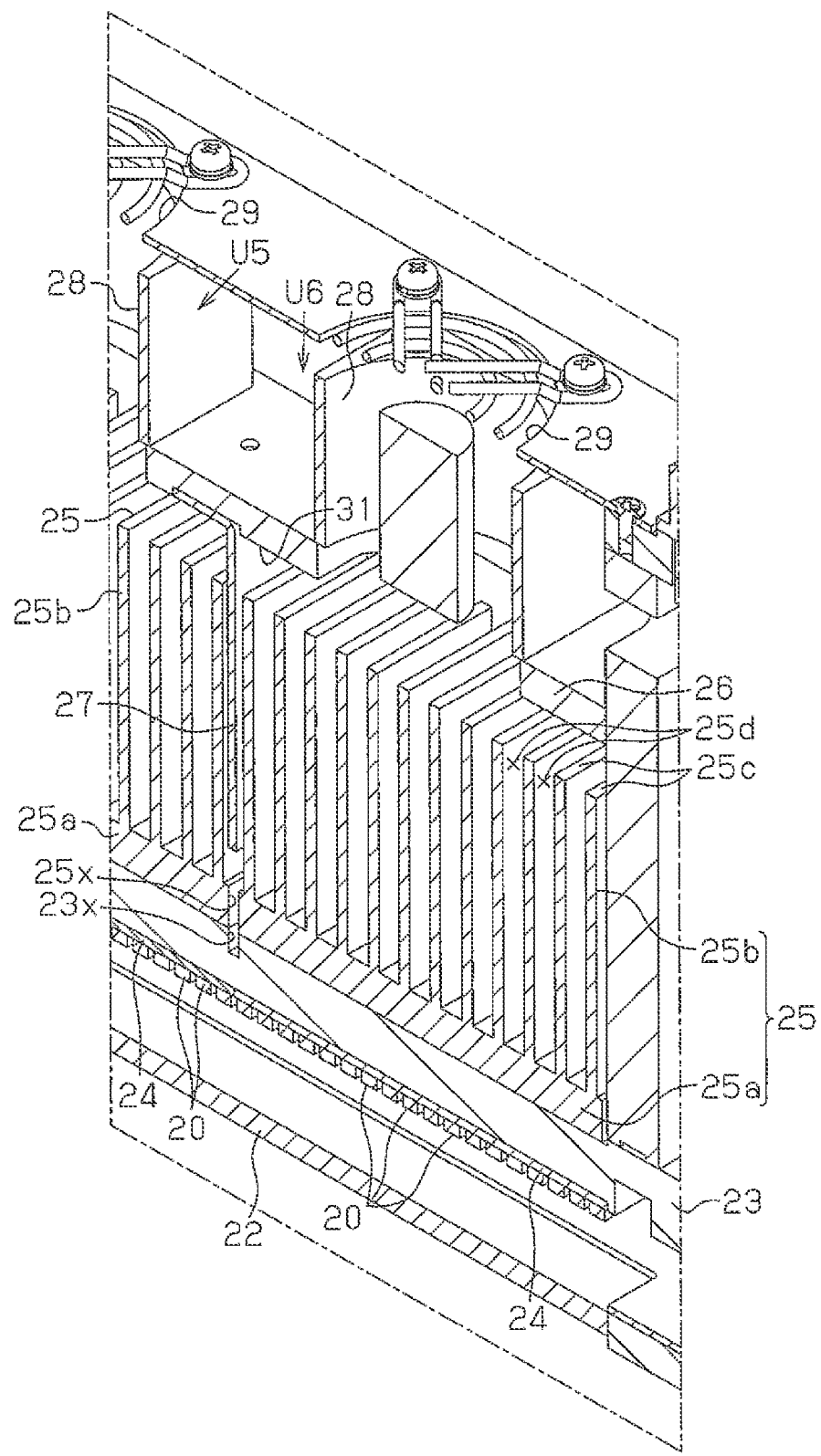
FIG. 3 is a sectional perspective view showing a part of the irradiation head in an enlarged manner.

As shown in FIG. 3, a gap 25x is provided as well as the heat-insulating structure including the partition plate 27 between the base segments 25a of adjacent ones of the heat sinks 25. The base plate 23 is provided with a groove part 23x continuous with the gap 25x. The gap 25x and the groove part 23x suppress transfer of heat generated in the units U1 to U6 together with the partition plate 27. While the irradiation head 11 is in use, all the LED elements 20 in the units U1 to U6 may be turned on or some of the LED elements 20 in the units U1 to U6 may be turned on. Heat insulation by the heat-insulating structure including the partition plate 27, the gap 25x, and the groove part 23x is to be more responsive to a large temperature difference to occur if some of the LED elements 20 in the units U1 to U6 are turned on than a small temperature difference to occur between adjacent units if all the LED elements 20 in the units U1 to U6 are turned on. As an example of the former case, a large temperature difference may occur between the adjacent units U4 and U5 if the LED elements 20 in the units U1 to U4 are turned on while the LED elements 20 in the units U5 and U6 are turned off.

The six fan units 28 are installed on the base plate 26. One fan unit 28 is provided to each of the units U1 to U6. The fan unit 28 makes a motor rotate a fan, thereby generating cooling air. The fan unit 28 starts running simultaneously with turn-on of the LED elements 20. The fan unit 28 stops running simultaneously with turn-off of the LED elements 20.

Six vent holes 29 are formed in the back surface 21b of the case 21. Each of the vent holes 29 is arranged to face a corresponding fan unit 28. As shown in FIG. 5, a vent hole 30a and a vent hole 30b are further formed in the side surfaces 21c and 21d of the case 21 respectively. Each of the vent holes 30a and 30b is formed to form a pair together with the vent hole 29. The vent holes 30a and 30b are formed of long openings extending in the longitudinal direction across the all units U1 to U6. Thus, the base ends of the fin segments 25b of all the heat sinks 25 are exposed through the vent holes 30a and 30b to the outside entirely as viewed in the longitudinal direction. As viewed in the depth direction, the base ends of the fin segments 25b are exposed only partially to the outside through the vent holes 30a and 30b.

Figure 4:
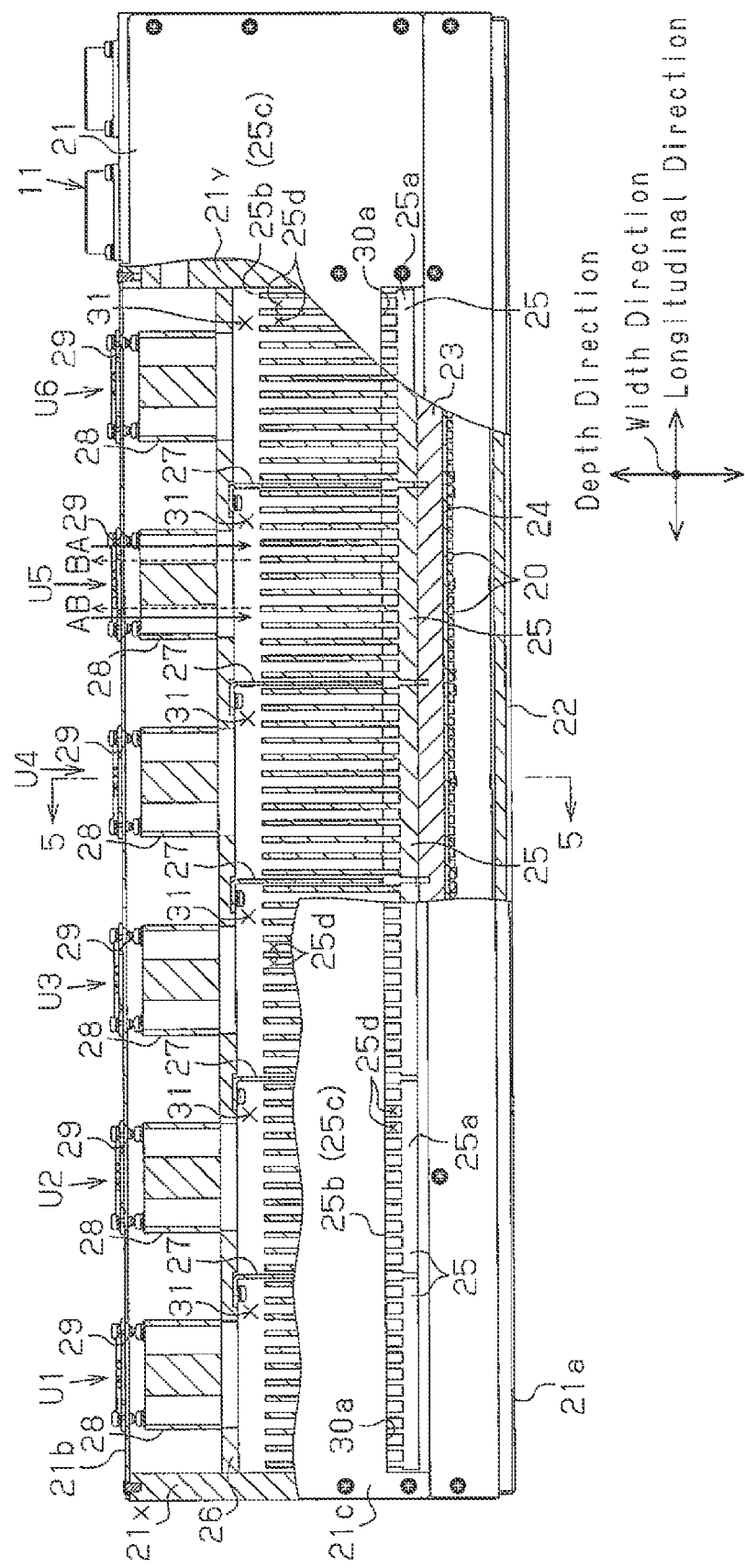
FIG. 4 is a vertical sectional view of the irradiation head.

A fan unit prepared as the fan unit 28 includes an intake fan unit that sucks in air through the vent hole 29 in the back surface 21b of the case 21 and exhausts air through the vent holes 30a and 30b, and an exhaust fan unit that exhausts air through the vent hole 29 and sucks in air through the vent holes 30a and 30b. Solid lines A with arrows of FIGS. 4 and 5 show a flow of cooling air formed by using the intake fan unit 28. Dashed lines B with arrows of FIGS. 4 and 5 show a flow of the cooling air formed by using the exhaust fan unit 28.

As described above, the units U1 to U6 are separated with the side wall members 21x and 21y and the partition plates 27. Space functioning as a pressure chamber 31 is formed between the distal end of the fin segment 25b of the heat sink 25 and the base plate 26.

The space in the pressure chamber 31 defined by the side wall member 21x or 21y and the partition plate 27 or by the partition plates 27 has a cross-sectional area same as that of corresponding space in the fin segment 25b. Meanwhile, a flow path area of cooling air formed by the fan unit 28 is smaller in the fin segment 25b by the presence of the fins 25c than in the pressure chamber 31. A flow path area in the fin segment 25b is determined by the sum of gaps 25d between all the fins 25c of this fin segment 25b. The fin segment 25b substantially abuts on the side surfaces 21c and 21d of the case 21 in the width direction. Thus, each gap 25d between the fins 25c is substantially blocked in a part except where the vent holes 30a and 30b are present. Where the sum of the areas of the vent holes 30a and 30b is defined as S1 and the sum of the areas of the gaps 25d between the distal ends of all the fins 25c is defined as S2, S1 and S2 satisfy S1<S2.

As understood from above, the cooling air passes through the gaps 25d between the fins 25c where the flow path of the cooling air is narrowed. The intake fan unit 28 places the pressure chamber 31 in a positively pressurized condition. The exhaust fan unit 28 places the pressure chamber 31 in a negatively pressurized condition. The flow of the cooling air is likely to be deflected in response to the rotation of the fan unit 28. Meanwhile, placing the pressure chamber 31 between the fan unit 28 and the fin segment 25b of the heat sink 25 in a positively or negatively pressurized condition makes deflection unlikely to occur in the flow of the cooling air. As a result, in the fin segment 25b, the cooling air acts uniformly on the gaps 25d between the multiple fins 25c.

The irradiation head 11 is connected to the controller 12. The controller 12 controls turn-on of the LED elements 20 and running of the fan unit 28. The irradiation head 11 is used in a manufacturing line where ultraviolet curable materials applied to products are cured, for example. A range of turn-on of the LED elements 20 can be changed by the units U1 to U6 in advance or as occasion arises.

The action of the heat dissipation structure of the irradiation head 11 is described next.

In the irradiation head 11, the positions of the fan unit 28 and the vent holes 29, 30a and 30b in the case 21 relative to each other determine the flow of the cooling air as follows. In the case of the intake fan unit 28, the cooling air passes through the vent hole 29, the fan unit 28 and the pressure chamber 31 in this order. Next, the cooling air travels from each gap 25d between the distal ends of the fins 25c toward the base end of each fin 25c and is then discharged through the vent holes 30a and 30b out of the irradiation head 11. In the case of the exhaust fan unit 28, the cooling air flows in through the vent holes 30a and 30b. Next, the cooling air travels from each gap 25d between the base ends of the fins 25c toward the distal ends of each fin 25c. Then, the cooing air passes through the pressure chamber 31, the fan unit 28, and the vent hole 29 in this order. In this case, the cooling air extends through each gap 25d between the fins 25c of the fin segment 25b sufficiently. Specifically, the cooling air extends from the distal end to reach the base end of each fin 25c, so that the cooling air acts on substantially all of the fin segment 25b.

The presence of the pressure chamber 31 distributes the cooling air uniformly in the direction in which the fins 25c are aligned and the width direction. This allows the cooling air to easily go into the gaps 25d between all the fins 25c extending from the central part toward the end part of the fin segment 25b. Thus, the heat sink 25 dissipates heat uniformly from the entire fin segment 25b. The fins 25c of the heat sink 25 are aligned in the same direction in which the LED elements 20 are aligned. Thus, all the LED elements 20 are cooled uniformly.

In some cases, some vent holes different from the vent holes 30a and 30b may be formed in the outer surface of the case 21. This weakens the function of the pressure chamber 31, so that the cooling wind acts in a way differing between the central part and the end part of the fin segment 25b. This narrows a part of the gap 25d between the fins 25c functioning as a flow path, so that the cooling air does not extend sufficiently through the gap 25d between the fins 25c. Further, in this embodiment, the fin segment 25b entirely faces the pressure chamber 31. In contrast, if the pressure chamber 31 is smaller than the fin segment 25b, heat dissipation performance achieved by a part of the fin segment 25b may become lower than that achieved by the remaining part of the fin segment 25b. As an example of this case, a wall may exist between a part of the fin segment 25b and the pressure chamber 31. In this case, heat dissipation by the heat sink 25 varies partially, making it impossible to uniformly cool the LED elements 20 in alignment.

In contrast, the heat dissipation structure of this embodiment can uniformly cool the LED elements 20 in alignment. This can control variation in the respective intensities of ultraviolet rays emitted from the LED elements 20 at a low level. As a result, an entire ultraviolet curable material applied in a linear pattern can be cured uniformly.

Thus, the present invention achieves the following effects.

(1) The fan unit 28 is arranged near the distal end of the fin segment 25b of the heat sink 25 thermally connected to the substrate 24 on which the LED elements 20 are mounted. The vent holes 30a and 30b are formed in the case 21. The base end of the fin segment 25b of the heat sink 25 is exposed through the vent holes 30a and 30b to the outside entirely as viewed in the direction in which the fins 25c are aligned. In the width direction perpendicular to the direction in which the fins 25c are aligned, each gap 25d between the fins 25c is substantially blocked by the case 21 in a part except where the vent holes 30a and 30b are present. Specifically, each gap 25d between the multiple fins 25c forming the fin segment 25b can function as a flow path through which the cooling air from the fan unit 28 passes. The space between the distal end of the fin segment 25b and the fan unit 28 functions as the pressure chamber 31. The cooling air from the fan unit 28 places the pressure chamber 31 in a positively or negatively pressurized condition. The pressure chamber 31 makes deflection unlikely to occur in the flow of the cooling air, so that the cooling air acts uniformly on the entire fin segment 25b. As a result, the heat sink 25 can cool the LED elements 20 uniformly mounted on the substrate 24. This can make the intensities of ultraviolet rays emitted from the LED elements 20 uniform.

(2) The irradiation head 11 houses the units U1 to U6 in alignment. The units U1 to U6 are each formed of the substrate 24 on which the LED elements 20 are mounted, the heat sink 25, and the fan unit 28. The partition plate 27, the gap 25x between the base segments 25a of adjacent ones of the heat sinks 25, and the groove part 23x in the base plate 23 are formed between adjacent ones of the units U1 to U6. The partition plate 27, the gap 25x and the groove part 23x function as insulation to suppress the transfer of heat between the units U1 to U6. If a range of turn-on of the units U1 to U6 is changed according to the size of a target of irradiation, for example, a large difference is generated between a temperature inside a unit being turned on and a temperature inside a unit being turned off. This temperature difference particularly affects the heat sink 25 and the substrate 24 arranged near a boundary between the unit being turned on and the unit being turned off, and the intensities of ultraviolet rays from the LED elements 20. In this case, the intensities of ultraviolet rays from the LED elements 20 do not become uniform as a whole. In this regard, in this embodiment, the heat-insulating structure is provided in the boundary between adjacent ones of the units U1 to U6. This makes variation unlikely to occur in the intensities of ultraviolet rays from LED elements in the unit being turned on adjacent to the unit being turned off.

The aforementioned embodiment can be changed as follows.

The LED elements 20 may be arranged in rows.

The vent holes 30a and 30b are each an opening extending in the longitudinal direction. Alternatively, each of the vent hole 30a and 30b may be multiple openings. In this case, it is preferable that each of the vent holes 30*a* and 30*b* be formed so as to expose the gap 25*d* at least between the base ends of the fins 25*c*.

The base plate 23 arranged between the substrate 24 on which the LED elements 20 are mounted and the heat sink 25 may be omitted. In this case, the substrate 24 and the heat sink 25 may be thermally connected by forming direct abutting contact therebetween. Alternatively, a heat-conducting member may be arranged between the substrate 24 and the heat sink 25.

The partition plate 27 may be fixed to a member other than the base plate 26. As an example, the partition plate 27 may be fixed to the case 21.

The heat-insulating structure including the gap 25*x* between the base segments 25*a* of the heat sink 25 and the groove part 23*x* in the base plate 23 to achieve air heat insulation may be replaced by a heat-insulating structure formed by using a material of high heat-insulating performance.

In the fin segment 25*b* of the heat sink 25, the gap 25*d* as an opening extending in the width direction is substantially blocked by the case 21. Alternatively, the gap 25*d* may be blocked by a member other than the case 21.

The irradiation head 11 may be formed of one to five units or seven or more units.

We claim:

1. An ultraviolet irradiation head comprising
a substrate,
multiple ultraviolet LED elements arranged on the substrate,
a heat sink thermally connected to the substrate, and
a fan unit,
the heat sink including a fin segment formed of multiple fins aligned in a direction in which the ultraviolet LED elements are aligned, and wherein in operation, cooling air travels from the fan unit and acts on the fin segment to cool the ultraviolet LED elements, wherein the fan unit is arranged near a distal end of the fin segment,
a vent hole is formed in a case of the irradiation head, and the vent hole is formed to expose a base end of the fin segment entirely in the direction in which the fins are aligned, wherein the vent hole is formed over gaps between all of the fins,
and wherein a flow path area of the cooling air flowing through the vent hole is less than a flow path area of the cooling air flowing through the gaps between all of the fins,
the heat sink is configured such that each gap between the fins is substantially blocked in a part other than where the vent hole is present,
the gap is an opening extending in a width direction perpendicular to the direction in which the fins are aligned, and
space between the distal end of the fin segment and the fan unit functions as a pressure chamber that is placed in a positively pressurized condition or a negatively pressurized condition by the cooling air from the fan unit.

2. The ultraviolet irradiation head according to claim 1, comprising:
multiple units arranged in the direction in which the LED elements are aligned, wherein the units each include the substrate on which the ultraviolet LED elements are mounted, the heat sink, and the fan unit; and
insulation that suppresses transfer of heat between adjacent ones of the units.

3. An ultraviolet irradiator comprising:
the ultraviolet irradiation head according to claim 1; and
a controller that controls the ultraviolet irradiation head,
wherein the control of the ultraviolet irradiation head includes control of activation of the ultraviolet LED elements and control of running of the fan unit.

* * * * *